(12) United States Patent
Hayashi et al.

(10) Patent No.: US 7,994,443 B2
(45) Date of Patent: Aug. 9, 2011

(54) SWITCH ARRAY

(75) Inventors: Masato Hayashi, Kobe (JP); Masami Yakabe, Tokyo (JP); Tetsuya Hasebe, Tokyo (JP); Muneo Harada, Nishinomiya (JP); Katsuya Okumura, Tokyo (JP)

(73) Assignees: Tokyo Electron Limited, Tokyo (JP); Octec Inc., Tokyo (JP)

( * ) Notice: Subject to any disclaimer, the term of this patent is extended or adjusted under 35 U.S.C. 154(b) by 895 days.

(21) Appl. No.: 11/886,856

(22) PCT Filed: Mar. 20, 2006

(86) PCT No.: PCT/JP2006/305517
§ 371 (c)(1),
(2), (4) Date: Sep. 21, 2007

(87) PCT Pub. No.: WO2006/101067
PCT Pub. Date: Sep. 28, 2006

(65) Prior Publication Data
US 2009/0045039 A1    Feb. 19, 2009

(30) Foreign Application Priority Data
Mar. 22, 2005 (JP) .................................. 2005-082121

(51) Int. Cl.
*H01H 1/00* (2006.01)
*H01H 9/00* (2006.01)
(52) U.S. Cl. .......................................... 200/238; 439/44
(58) Field of Classification Search ................. 200/238, 200/181, 511, 512, 61.08; 439/44
See application file for complete search history.

(56) References Cited

U.S. PATENT DOCUMENTS

| | | | |
|---|---|---|---|
| 5,723,834 A * | 3/1998 | Hambleton et al. | 200/61.54 |
| 6,307,169 B1 * | 10/2001 | Sun et al. | 200/181 |
| 6,717,825 B2 * | 4/2004 | Volstorf | 361/803 |
| 6,859,119 B2 * | 2/2005 | Eliacin et al. | 333/262 |
| 6,876,047 B2 * | 4/2005 | Cunningham et al. | 257/415 |
| 6,963,117 B2 * | 11/2005 | Yang et al. | 257/415 |

FOREIGN PATENT DOCUMENTS

| | | |
|---|---|---|
| JP | 56-73495 | 6/1981 |
| JP | 03-127736 | 12/1991 |

(Continued)

OTHER PUBLICATIONS

European Search Report dated Jun. 4, 2009.

*Primary Examiner* — Edwin A. Leon
*Assistant Examiner* — Lheiren Mae Caroc
(74) *Attorney, Agent, or Firm* — Finnegan, Henderson, Farabow, Garrett & Dunner, LLP

(57) ABSTRACT

A first wiring layer 16 is disposed on an insulating film 14 on the lower surface of an upper substrate 15, while a second wiring layer 13 three-dimensionally crossing the first wiring layer 16 is provided on the insulating film 12 on a lower substrate 11. A cantilever 17 has one end connected to the first wiring layer 16 and the other end opposed to the second wiring layer 13 with a space therebetween. A thermoplastic sheet 19 is arranged on the upper substrate 15 so as to cover the through-hole 18. The thermoplastic sheet 19 is pressed by a heated pin 20 against the cantilever 17 and deformed so as to maintain the connection between the cantilever 17 and the second wiring layer 13, and therefore close the switch 10.

18 Claims, 12 Drawing Sheets

FOREIGN PATENT DOCUMENTS

| | | |
|---|---|---|
| JP | 07-161255 | 6/1995 |
| JP | 07-245034 | 9/1995 |
| JP | 10-283893 | 10/1998 |
| JP | 2000-188049 | 7/2000 |
| JP | 2004-200008 | 7/2004 |
| WO | WO 03/017301 A1 | 2/2003 |

* cited by examiner

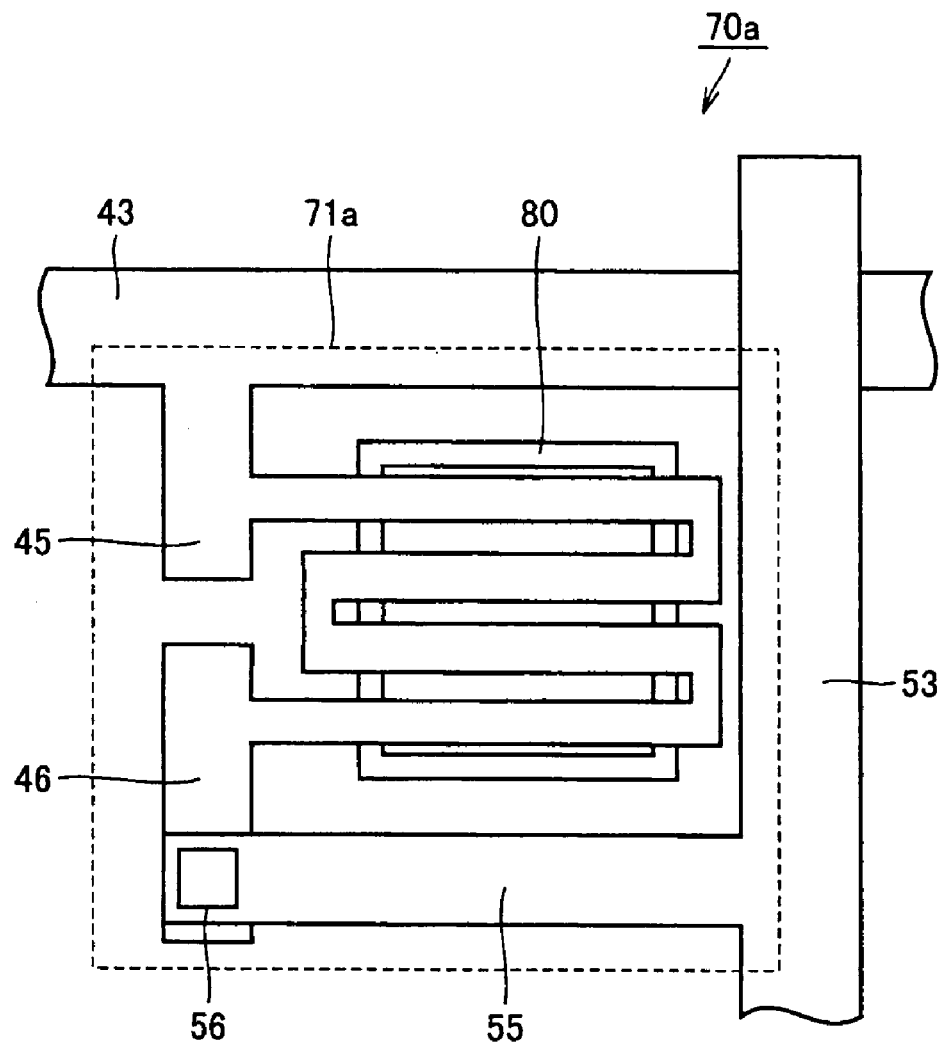

SWITCH ARRAY

TECHNICAL FIELD

This invention relates to a switch array, and for example, relates to a switch array that makes and breaks any connection of a plurality of input lines and a plurality of output lines.

BACKGROUND ART

As an example of a switch array capable of selectively making and breaking any connection of a plurality of input lines and a plurality of output lines, Japanese unexamined patent publication No. 10-283893 discloses a relay-embedded board. This relay-embedded board disclosed in publication No. 10-283893 includes nine ultra small relays embedded on a thin substrate, each relay being placed in each cross area where three inputs and three outputs cross each other. This example allows any desired relays to be switched on and off.

Because the relays of the relay-embedded board disclosed in publication No. 10-283893 are ultra small, the contact capacity of each relay is also small. The relay-embedded board can pass and interrupt a minute amount of control current, but can not be used for some applications such as lighting apparatuses, because switching on and off such lighting apparatuses requires the relays to pass and interrupt a few amperes of current.

One possibility to allow the flow of such a large current is to use a large relay, however, such a large relay requires a relatively large installation space. Especially, when the large relay is used for a switch array having many cross areas, for example an array size of 128×128 or 256×256, the apparatus incorporating the switch array will be extremely large. Further, if an on-resistance at a relay contact cannot be maintained at 1Ω or lower, the relay causes voltage drop at the relay contact or produces heat at the relay contact when a large current passes through the relay in the on state. Besides, in order to maintain the on state, a driving current must be kept flowing through a relay's coil which is closed in the on state, therefore increasing a consumption current.

There are switch arrays using switching elements such as a MOSFET instead of the relay contact. However, such switch arrays have a high on-resistance and cause a large amount of current leakage in the off state, whereby being prone to break the elements during the flow of the large current.

DISCLOSURE OF THE INVENTION

The present invention has an object to provide a switch array allowing a large current to flow therethrough, having a low on-resistance, and maintaining a connection without the driving current.

This invention is directed to a switch array comprising a first wiring layer, a second wiring layer three-dimensionally crossing the first wiring layer, and a connecting structure disposed in a cross area between the first wiring layer and second wiring layer and for selectively connecting the first and second wiring layers. The connecting structure includes a deformable member having one end connected to the first wiring layer and the other end opposed to the second wiring layer with a space therebetween in an insulated state. The deformable member is deformed to electrically connect the other end thereof to the second wiring layer, and then maintains the connection.

This simple structure involving the deformation of the deformable member and the maintenance of the deformation enables a large current flow, reduction of the on-resistance, and elimination of the need for a driving current.

Preferably, the invention is directed to a switch array comprising a first substrate and a second substrate disposed at a distance away from each other. The first substrate is provided with the first wiring layer and a through-hole formed near a position aligned with the other end of the deformable member. The connecting structure includes a connection-maintaining member arranged so as to cover the through-hole. The connection-maintaining member passes through the through-hole while changing its shape, and then presses the deformable member. In this example, just by causing the connection-maintaining member to pass through the through-hole to press the deformable member, the connection between the first and second wiring layers can be maintained via the deformable member.

In one embodiment, the connection-maintaining member is deformed by application of heat in order to press the deformable member. In another embodiment, the connection-maintaining member, due to its own thermal deformation characteristics, expands, shrinks and changes its shape by application of heat to press the deformable member. In yet another embodiment, the connection-maintaining member includes an adhesive member that maintains the connection between the deformed deformable member and the second wiring layer with an adhesive force. These connection-maintaining members can maintain the connection between the first and second wiring layers through the deformable member without a driving current.

Another aspect of the present invention is directed to a switch array comprising a first wiring layer disposed on one surface of an insulating layer, a second wiring layer disposed on the other surface of the insulating layer so as to three-dimensionally cross the first wiring layer in an insulated state, and a through-hole formed in an area of the insulating layer where the first wiring layer three-dimensionally crosses the second wiring layer. The through-hole is to be filled with a conductive member. Filling the conductive member into the through-hole electrically connects the first wiring layer and second wiring layer.

According to this invention, just filling the conductive member into the through-hole can eliminate the need for a driving current and electrically connect the first wiring layer and second wiring layer.

Yet another aspect of the present invention is directed to a switch array comprising a first wiring layer, a second wiring layer three-dimensionally crossing the first wiring layer in a connected state, and a connecting structure disposed in a three-dimensional cross area and for selectively electrically connecting the first wiring layer and second wiring layer. The connecting structure includes an interconnect layer having one end connected to the first wiring layer and the other end connected to the second wiring layer. Cutting the interconnect layer breaks the connection between the first wiring layer and second wiring layer.

This invention can normally maintain the connection between the first and second wiring layers, while being able to break the connection between the first and second wiring layers by cutting the interconnect layer, thereby eliminating the need for a driving current used for maintaining the connection.

One embodiment includes a film extending over a space and cuts the interconnect layer formed on the film by applying mechanical pressure. In yet another embodiment, the interconnect layer is a wiring layer having a high resistance component as compared with the first and second wiring layers and is fused by feeding a large current between the first and second wiring layers. In both embodiments, the connection between the first and second wiring layers can be maintained by the interconnect layer and broken by cutting the interconnect layer.

Yet another aspect of the present invention is directed to a switch array comprising first wiring layers, second wiring layers three-dimensionally crossing the first wiring layers in an insulated state, connecting structures disposed in respective cross areas between the first wiring layers and second wiring layers and for selectively connecting the first and second wiring layers. At least one group of either first wiring layers or second wiring layers is configured to be displaceable toward the other group of the first or second wiring layers and to maintain the displacement. Each connecting structure includes a conductive member in which only the part that is applied with pressure produces conductivity between the first and second wiring layers. Each connecting structure includes connection areas each opposed to the first or second wiring layers. The connection areas electrically connect the first and second wiring layers by displacing either first wiring layers or second wiring layers to apply a pressure to the conductive member.

In this invention, pressing either first wiring layers or second wiring layers makes an electrical connection between the first and second wiring layers via the conductive member, thereby enabling the maintenance of the connection without a driving current.

Preferably, the connection areas are electrodes arranged on the first and second wiring layers, and further include insulators placed on electrodes except for predetermined electrodes. The electrodes having the insulators do not make a connection with the opposite electrodes.

Preferably, the conductive member is an insulative elastic sheet containing conducting particles.

Yet another aspect of the present invention is directed to a switch array comprising first wiring layers, second wiring layers three-dimensionally crossing the first wiring layers in an insulated state, third wiring layers three-dimensionally crossing the first wiring layers in an insulated state, connecting structures each disposed in respective cross areas between the first wiring layers and second and third wiring layers and for selectively connecting the first wiring layers and second or third wiring layers. The first wiring layers can partially displace themselves at crossing parts thereof that three-dimensionally cross the second and third wiring layers and can maintain the displacement. The selectively displaced parts realize an electrical connection at the crossing parts.

In this invention, it is also possible to displace either second wiring layers or third wiring layers to make an electrical connection with the first wiring layers, that is, the first wiring layer can be connected to only the displaced wiring layer but not to the other non-displaced wiring layers.

Preferably, each first wiring layer includes a first branch layer and a second branch layer branched off therefrom and three-dimensionally crossing the second and third wiring layers. The first branch layer and second branch layer can be displaced and maintain the displacement. The displaced branch layer realizes an electrical connection at their crossing parts with the second and third wiring layers.

The switch array according to the present invention enables the large current flow, reduction of the on-resistance, and the maintenance of the connection without the driving current.

BRIEF DESCRIPTION OF THE DRAWINGS

FIG. 11 illustrates a modification of the switch array shown in FIG. 9.

BEST MODE FOR CARRYING OUT THE INVENTION

Figure 1A:
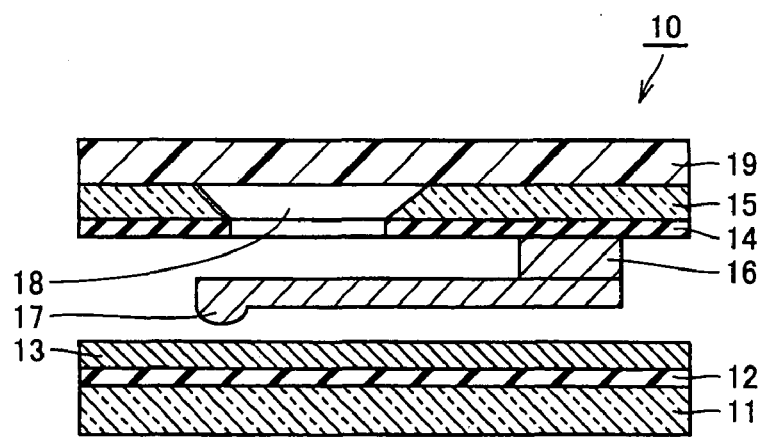
FIG. 1A is a cross-sectional view illustrating a switch with a thermoplastic sheet, included in a switch array according to one embodiment of the present invention.
Figure 1B:
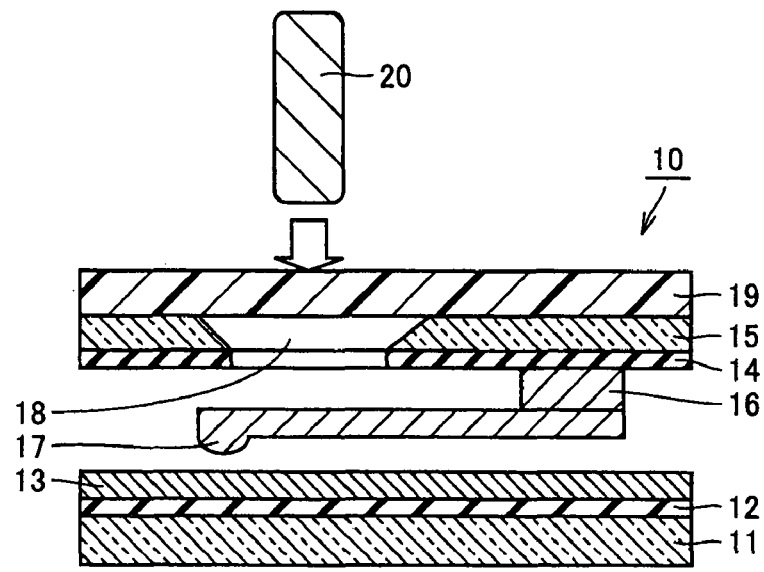
FIG. 1B is a cross-sectional view illustrating the switch with the thermoplastic sheet being pressed by a pin, included in the switch array according to one embodiment of the present invention.
Figure 1C:
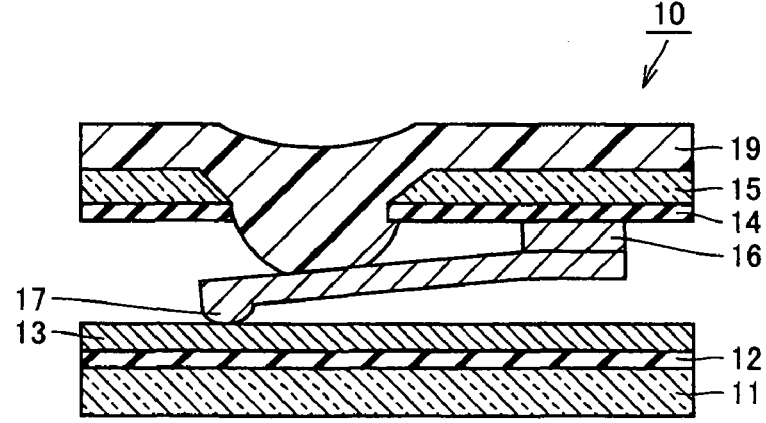
FIG. 1C is a cross-sectional view illustrating the switch closed by deforming the thermoplastic sheet, included in the switch array according to one embodiment of the present invention.

FIGS. 1A to 1C are cross-sectional views illustrating a switch included in a switch array according to one embodiment of the present invention. In FIG. 1A, a switch 10 is disposed in a cross area of the switch array. An insulating film 14 and an upper substrate 15 are provided in a parallel, spaced apart relationship with respect to a lower substrate 11 and an insulating film 12. A first wiring layer 16 is placed on the lower face of the insulating film 14, while a second wiring layer 13 is placed on the insulating film 12 so as to three-dimensionally cross the first wiring layer 16.

In the cross area between the first wiring layer 16 and the second wiring layer 13, a cantilever 17 is provided functioning as a deformable member and has one end connected to the first wiring layer 16 and the other end opposed to the second wiring layer 13 with a space therebetween in an insulated state. The cantilever 17 can make a connection with the second wiring layer 13 at the other end by changing its shape. The first wiring layer 16, second wiring layer 13 and cantilever 17 are made of metallic materials such as nickel and copper. The other end of the cantilever 17 can be selectively shaped into an appropriate one so as to make the on-resistance created with the second wiring layer 13 low.

A through-hole 18 is formed by wet etching in the insulating film 14 and upper substrate 15 near a position corresponding to the other end of the cantilever 17. The through-hole 18 formed by wet etching is tapered so as to have a larger opening on the upper surface of the upper substrate 15 and a smaller opening on the lower surface of the upper substrate 15. This is to make it easy to insert a pin 20 shown in FIG. 1B into the through-hole 18.

On the upper substrate 15, a thermoplastic sheet 19 functioning as a heat-deformable connection-maintaining member, such as polyvinyl chloride, is arranged so as to cover the through-hole 18. The connection-maintaining member constitutes a connecting structure with the deformable member. As shown in FIG. 1B, the pin 20 is heated and then pressed against the upper surface, above the through-hole 18, of the thermoplastic sheet 19 toward the cantilever 17. The thermoplastic sheet 19 passes into the through-hole 18 while changing its shape to press the cantilever 17 as shown in FIG. 1C. This electrically connects the other end of the cantilever 17 with the second wiring layer 13 to close the switch 10.

Cooling the thermoplastic sheet 19 after being heated by the pin 20 maintains the connected state, shown in FIG. 1C, in which the other end of the cantilever 17 is in contact with the second wiring layer 13. This enables the maintenance of the connection without energy supply, or a continuous flow of currents after the switch 10 is closed. Further, because the cantilever 17 can be selectively shaped into a desired one, it is possible to make the contact area between the second wiring layer 13 and the other end of the cantilever 17 larger, thereby enabling reduction of the on-resistance and the flow of a large current.

The material of the pin 20 is preferably selected from materials that do not adhere to the thermoplastic sheet 19 even after being pressed against the thermoplastic sheet 19. Further, the pin 20 should preferably be heated at a temperature or in an atmosphere that does not oxidize the cantilever 17 in consideration of the heat transferred to the cantilever 17 from the pin 20 upon being pressed against the thermoplastic sheet 19.

Figure 2:
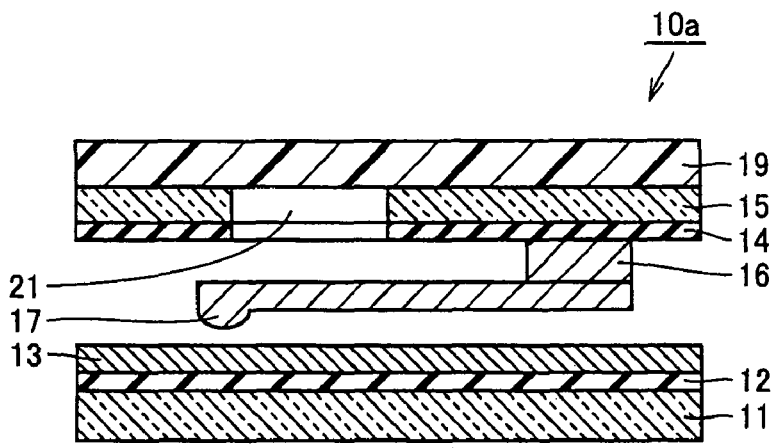
FIG. 2 is a cross-sectional view illustrating a modification of the switch with the thermoplastic sheet, included in the switch array according to one embodiment of the present invention.

In another embodiment as shown in FIG. 2, a switch 10a can comprise a through-hole 21, which has an upper opening and a lower opening with the same diameter, formed in the insulating film 14 and upper substrate 15 by dry etching.

In yet another embodiment, there is no necessity to provide the connection-maintaining member as long as something capable of maintaining its deformed shape is used for the cantilever 17.

Figure 3A:
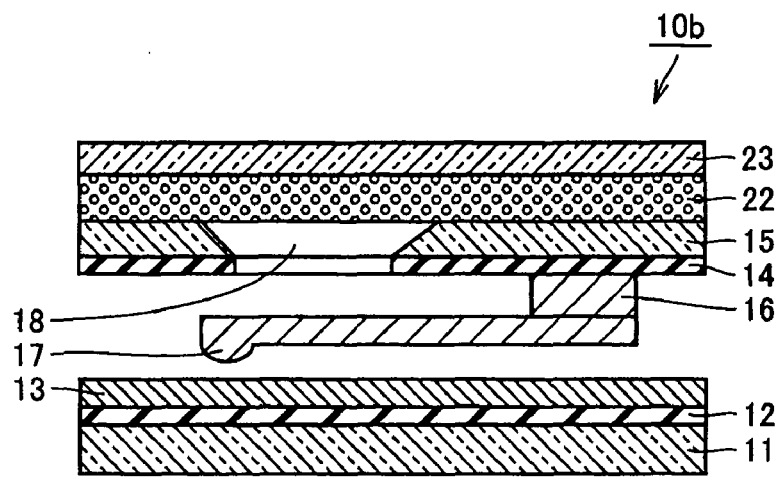
FIG. 3A is a cross-sectional view illustrating a switch with a foam sheet, included in a switch array according to another embodiment of the present invention.
Figure 3B:
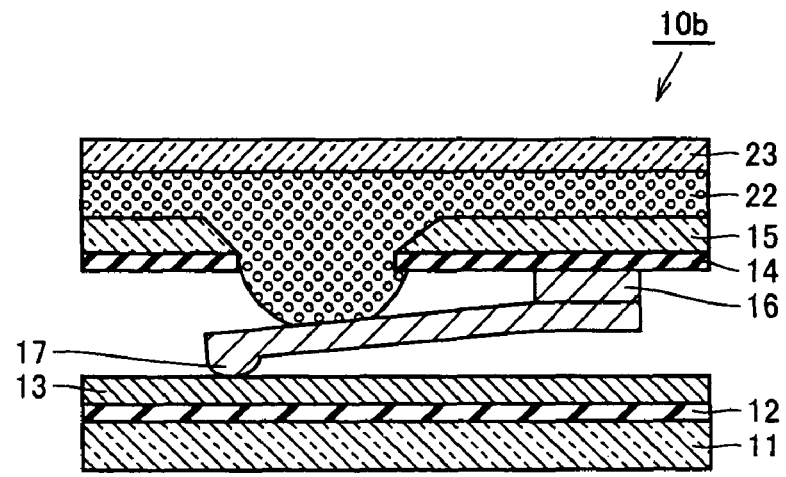
FIG. 3B is a cross-sectional view illustrating the switch closed by deforming the foam sheet, included in the switch array according to another embodiment of the present invention.

FIGS. 3A and 3B are cross-sectional views illustrating a modification of the switch 10 shown in FIGS. 1A to 1C. This modified switch 10b is formed by overlaying a foam sheet 22 functioning as a connection-maintaining member and a glass substrate 23 on the upper substrate 15 as shown in FIG. 3A instead of the thermoplastic sheet 19 shown in FIGS. 1A to 1C. The foam sheet 22 is made of an expandable material containing a great number of cells. When laser light is irradiated through the glass substrate 23 on the foam sheet 22, the internal cells of the heated foam sheet 22 expand. In addition to the material containing the cells, the expandable material may be any materials as long as the materials expand their volume by heat or have deformable characteristics.

The expanded foam sheet 22 passes through the through-hole 18 while changing its shape to press the cantilever 17 as shown in FIG. 3B, and therefore the other end of the cantilever 17 can contact with the second wiring layer 13. Cooling the foam sheet 22 can maintain the connection between the other end of the cantilever 17 and second wiring layer 13.

It should be noted that the heated pin 20 shown in FIG. 1B can be used to push the foam sheet 22 downward to press the cantilever 17. In this case the glass substrate 23 is not required.

In this embodiment, the deformed foam sheet 22 pressing the cantilever 17 can maintain the other end of the cantilever 17 in the connected state with the second wiring layer 13. This enables the maintenance of the connection without energy supply, or a continuous flow of currents after the switch 10b is closed. Further, the enlargeable contact area between the second wiring layer 13 and the other end of the cantilever 17 can reduce the on-resistance and flow a large current.

Figure 4A:
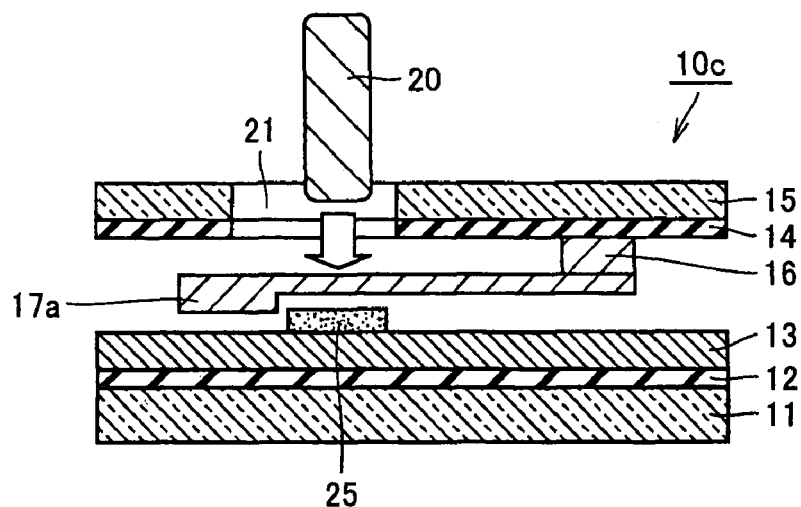
FIG. 4A is a cross-sectional view illustrating a switch with an adhesive layer, included in the switch array according to yet another embodiment of the present invention.
Figure 4B:
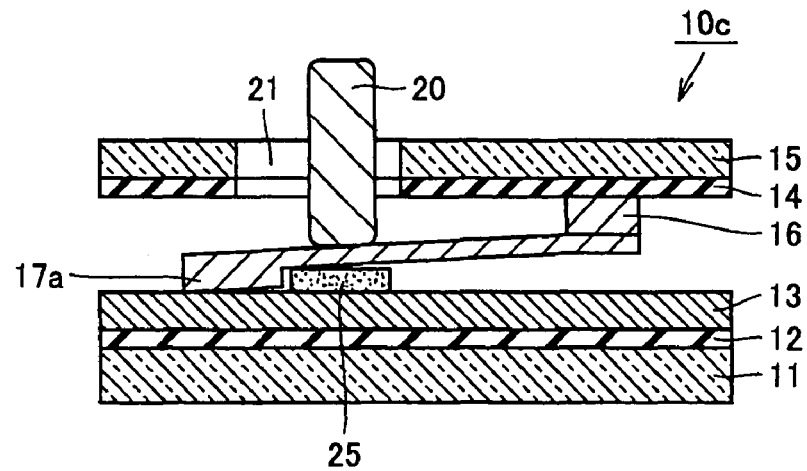
FIG. 4B is a cross-sectional view illustrating a cantilever connected to the adhesive layer, included in the switch array according to yet another embodiment of the present invention.
Figure 4C:
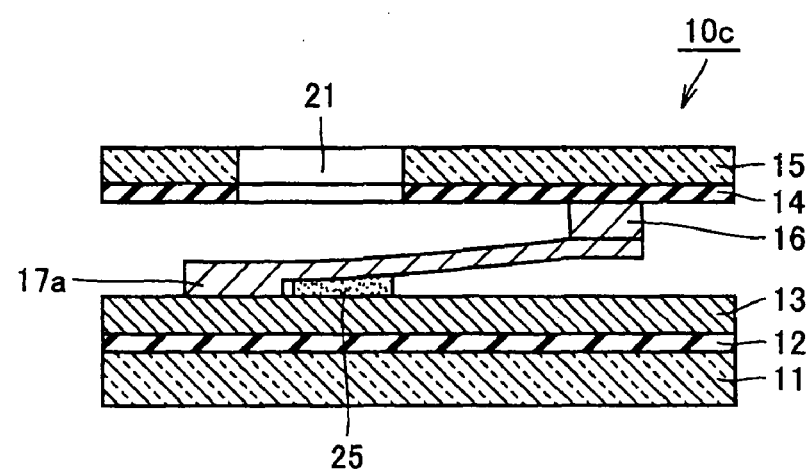
FIG. 4C is a cross-sectional view illustrating the other end of the cantilever being connected to a wiring layer, included in the switch array according to yet another embodiment of the present invention.

FIGS. 4A to 4C are cross-sectional views of a switch included in a switch array according to another embodiment of the present invention. Although the embodiment shown in FIGS. 1A to 1C uses the thermoplastic sheet 19 to allow the other end of the cantilever 17 to contact with the second wiring layer 13, this embodiment uses an adhesive layer 25 functioning as an adhesive member which is one example of the deformable member. Specifically, as shown in FIG. 4A, the second wiring layer 13 is formed on the insulating film 12 on the lower substrate 11, and one end of the cantilever 17a is connected to the first wiring layer 16 in the same manner as the embodiment shown in FIGS. 1A to 1C.

The other end of the cantilever 17a has a flat surface opposed to the second wiring layer 13. An adhesive layer 25 such as double-faced adhesive tape is attached on the second wiring layer 13 so that the adhesive layer 25 is opposed to the cantilever 17a in an insulated state but does not exist at a position aligned with the other end of the cantilever 17a. In the insulating film 14 and upper substrate 15, a through-hole 21 is formed at a position above the adhesive layer 25.

When the pin 20 shown in FIG. 4A presses the other end of the cantilever 17a, the other end of the cantilever 17a is depressed and the cantilever 17a changes its shape as shown in FIG. 4B, thus making contact between the cantilever 17a and the second wiring layer 13. Then, the deformed cantilever 17a is pressed against the adhesive layer 25 which keeps the deformation of the cantilever 17a through the adhesive force.

Since the deformation of the cantilever 17a is maintained by the adhesive force of the adhesive layer 25, even after the retraction of the pin 20, the cantilever 17a can maintain the other end in the connected state with the first wiring layer 13 as shown in FIG. 4C.

In this embodiment, the adhesive force of the adhesive layer 25 can maintain contact between the other end of cantilever 17a and the second wiring layer 13. This enables the maintenance of the connection without energy supply, or a continuous flow of currents after the switch 10c is closed. Since the contact area between the second wiring layer 13 and the other end of the cantilever 17a is enlargeable to any desired sizes in this embodiment, too, reduction of the on-resistance and the flow of a large current can be also achieved.

A preferable embodiment may use organic resin such as resist and polyimide for the adhesive layer 25. This organic resin can be expected to improve contact pressure due to thermal shrinkage of the adhesive layer 25 in addition to the improvement of the adhesive force, as functions of the adhesive layer 25.

Figure 5A:
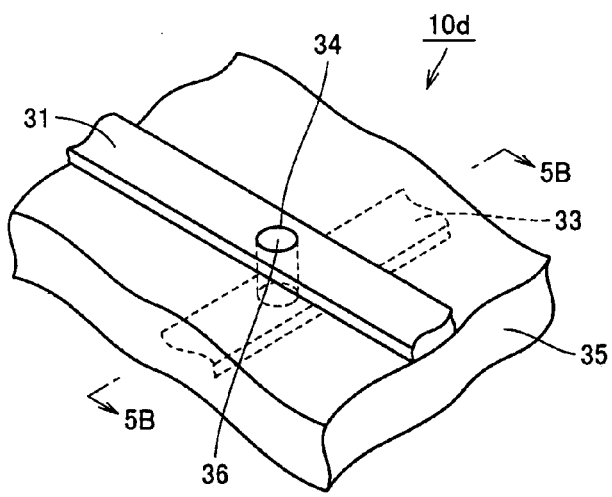
FIG. 5A is a perspective view of a relevant part of a switch included in a switch array according to yet another embodiment of the present invention.
Figure 5B:
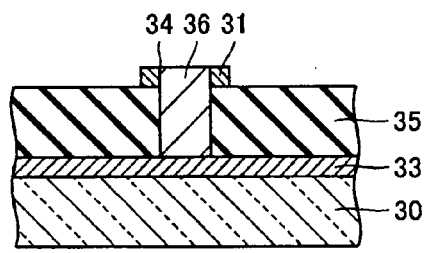
FIG. 5B is a transverse sectional view taken along lines 5B-5B of FIG. 5A.

FIGS. 5A and 5B illustrate a switch included in a switch array according to yet another embodiment of the present invention. FIG. 5A is a perspective view of a relevant part, while FIG. 5B is a cross-sectional view taken along lines 5B-5B of FIG. 5A. A switch 10d in this embodiment uses a conductive paste 36 functioning as a conductive member to electrically connect the wiring layers 31 and 33.

Specifically, a first wiring layer 31 and a second wiring layer 33 are formed with an interlayer insulating film 35 interposed therebetween on a substrate 30 as an insulating layer. The second wiring layer 33 three-dimensionally crosses the first wiring layer 31. In an area where the first wiring layer 31 and second wiring layer 33 are crossed, a through-hole 34 is formed to receive a conductive member. The through-hole 34 penetrates the first wiring layer 31 and interlayer insulating film 35, and therefore exposes a surface of the second wiring layer 33, adjacent to the interlayer insulating film 35.

In a case where the first wiring layer 31 and second wiring layer 33 need to be connected to each other, a conductive paste 36, for example, is filled in the through-hole 34. This electrically connects the wiring layers 31 and 33. Alternatively, melted solder may be poured into the through-hole 34 instead of the conductive paste 36. In a case where the first wiring layer 31 and second wiring layer 33 do not need to be connected, it is preferable to fill insulating paste, for example, into the through-hole 34 to prevent a surface leakage current flow.

In this embodiment, the switch 10d can be constituted only by crossing the first wiring layer 31 and second wiring layer 33 formed on both surfaces of the interlayer insulating film 35, forming the through-hole 34 in the first wiring layer 31 and interlayer insulating film 35 at the cross area, and filling the conductive paste 36 into the through-hole 34, which therefore provides an extremely simple structure of the switch. Further, this enables the maintenance of the connection without energy supply, or a continuous flow of currents after the switch 10d is closed. The direct connection of the first wiring layer 31 and second wiring layer 33 through the conductive paste 36 or solder can reduce the on-resistance to an almost negligible amount and allows a large current to flow.

Figure 6:
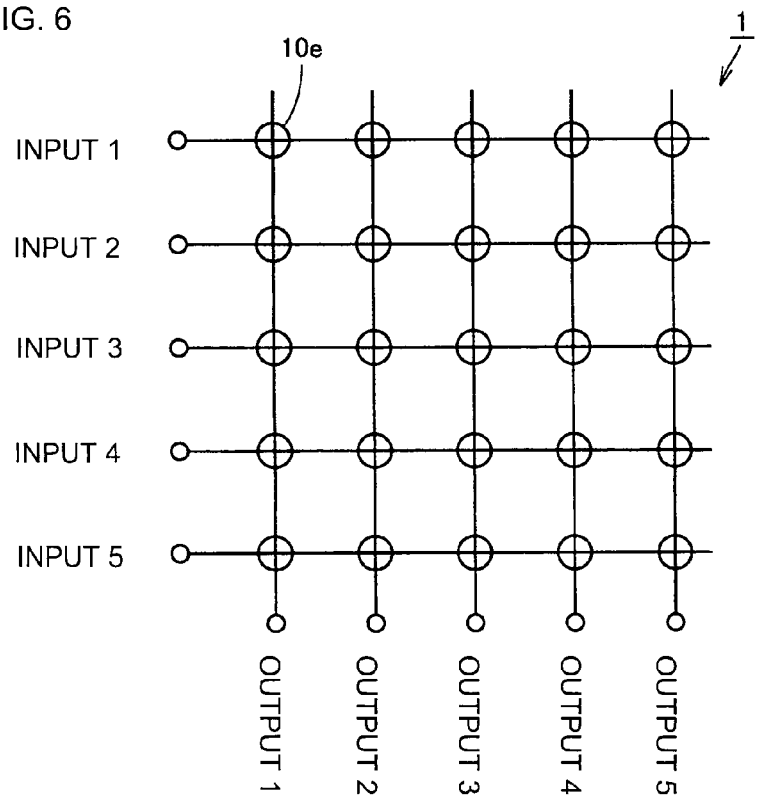
FIG. 6 illustrates a configuration of a switch array according to yet another embodiment of the present invention.

FIG. 6 illustrates a structure of a switch array according to yet another embodiment of the present invention. A switch array 1 shown in FIG. 6 is a matrix array of input lines from Input 1 to Input 5 crossed by output lines from Output 1 to Output 5 and includes switches 10e each connected at respective cross areas to connect the corresponding input line and output line. Any one of the aforementioned switches 10, 10a, 10b, 10c, 10d shown in FIGS. 1A, 1B, 1C to 5A and 5B, respectively, is applicable to the switches 10e. Tuning on the switch in any one of cross areas can connect the corresponding input and output.

In this embodiment, the switch array having a matrix arrangement of switches allows selection of the switch 10e in a desired cross area.

Although the switch array shown in FIG. 6 is designed to connect the switches 10e at the cross areas of the matrix with the plurality of inputs and outputs, the present invention is not limited to this. This invention can be applied to a switch array having a plurality of outputs for one input and a switch array having one output for a plurality of inputs.

Figure 7:
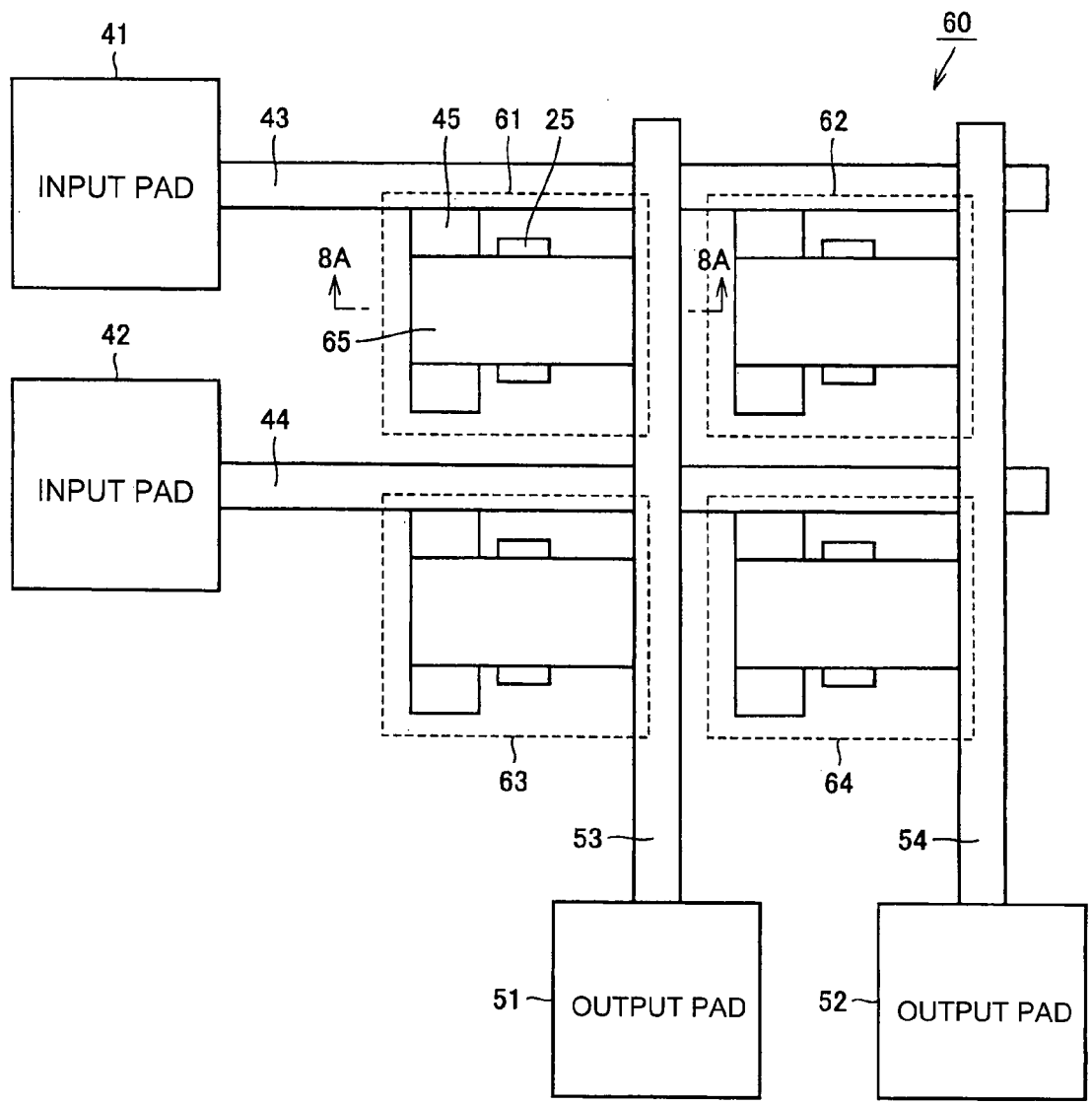
FIG. 7 is a plan view illustrating a switch array with adhesive layers according to the other embodiment of the present invention.
Figure 8:
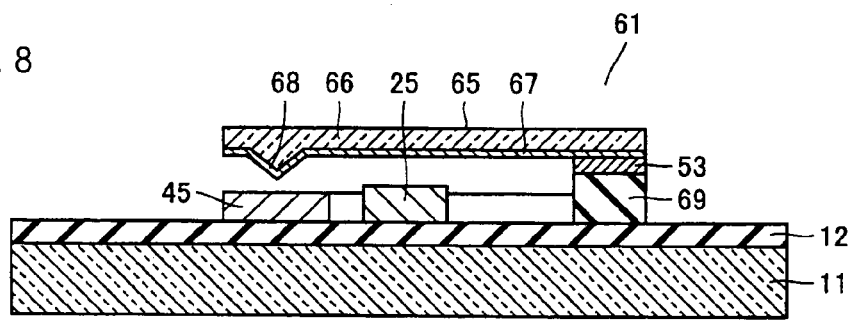
FIG. 8 is a cross-sectional view taken along lines 8A-8A in FIG. 7.

FIG. 7 is a plan view of a switch array according to another embodiment of the present invention. FIG. 8 is a cross-sectional view taken along lines 8A-8A of FIG. 7.

A switch array 60 of this embodiment comprises, for example, two inputs and two outputs. As shown in FIG. 8, an insulating film 12 is formed on a lower substrate 11, and input pads 41, 42 and output pads 51, 52, shown in FIG. 7 but not in FIG. 8, are formed on the insulating film 12.

Formed on the insulating film 12 are strip-like second wiring layers 43, 44 which are connected to the input pads 41, 42, respectively, and act as input lines. First wiring layers 53, 54 which are connected to the output pads 51, 52, respectively, and act as output lines are formed so as to three-dimensionally cross over the second wiring layers 43, 44, in an insulated state. The wiring layer 53 is formed on an insulating layer 69. Switches 61, 62, 63, 64, which are connecting structures, are connected at the respective cross areas between the second wiring layers 43, 44 and the first wiring layers 53, 54.

The switch 61 includes a wiring layer 45 formed so as to cross the second wiring layer 43 and connected to the second wiring layer 43, and a movable member 65 functioning as a deformable member and having one end connected to the first wiring layer 53. As shown in FIG. 8, the movable member 65 includes a metal layer 67 formed on the lower surface of a substrate 66 and a movable contact 68 formed on the other end of the movable member 65. The movable contact 68 is opposed to the wiring layer 45 with a space therebetween, and changes its shape to connect to the wiring layer 45. Provided between the metal layer 67 of the movable member 65 and the insulating film 12 is an adhesive layer 25 such as double-faced adhesive tape.

It is not shown in FIG. 8, however, an insulating film 14 and upper substrate 15 with a through-hole 21 formed therein as shown in FIGS. 4A to 4C may be formed at an upper position of the switch 61 so as to oppose to the lower substrate 11 and insulating film 12.

As mentioned above, the switch array 60 having two inputs and two outputs of this embodiment allows the movable contact 68 to contact with the wiring layer 45 by pressing the movable member 65 of any switches 61 to 64 in the cross areas and maintaining the deformation of the movable member 65 through an adhesive force of the adhesive layer 25. This enables the maintenance of the connection without energy supply, or a continuous flow of currents after any of switches 61 to 64 are closed. Since the movable contact 68 can be selectively shaped into a desired one in this embodiment, too, reduction of the on-resistance and the flow of a large current can be achieved.

Figure 9:
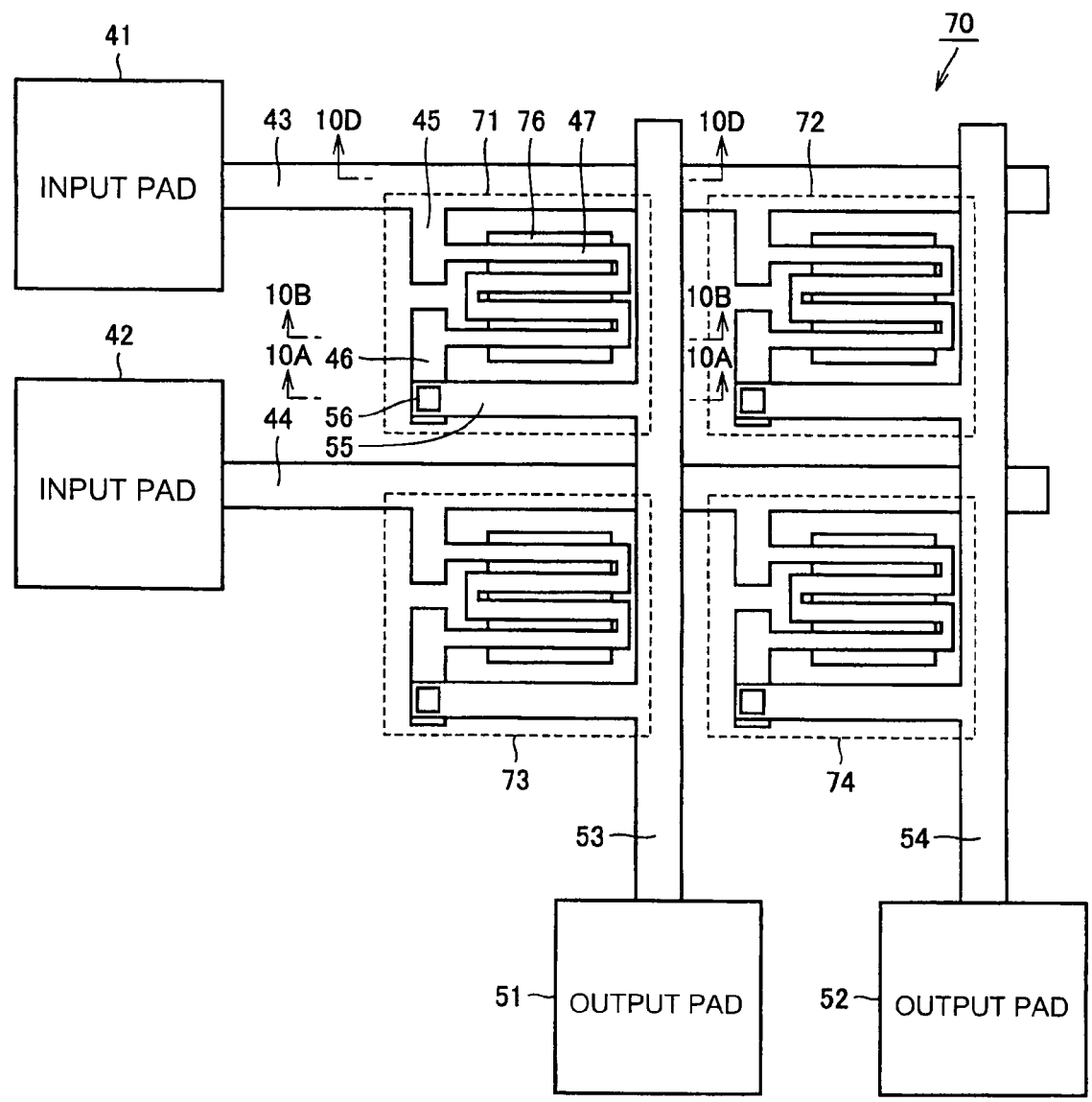
FIG. 9 is a plan view of a switch array with membranes according to yet another embodiment of the present invention.

FIG. 9 is a plan view of a switch array according to yet another embodiment of the present invention. FIGS. 10A to 10D are cross-sectional views taken along lines 10A-10A, 10B-10B, 10D-10D of FIG. 9, respectively.

A switch array 70 shown in FIG. 9 includes input pads 41, 42, 51, 52 and wiring layers 43, 44, 53, 54, as with the switch array 60 of the embodiment shown in FIG. 7. Switches 71 to 74, which are connecting structures, are connected at cross areas between the wiring layers 43, 44 and 53, 54. The switch 71 includes a strip-like wiring layer 45 crossing the wiring layer 43 in a connected state, a strip-like wiring layer 55 crossing the wiring layer 53 in a connected state, a wiring layer 46 crossing and connected to the wiring layer 55 through a feedthrough conductor 56 and formed on an extension of the wiring layer 45, and an interconnect layer 47 formed to connect the wiring layers 45 and 46. The wiring layers 43, 45, 46 are formed on the insulating film 12 shown in FIGS. 10A to 10D, while the wiring layer 55 is formed on the interlayer insulating film 57.

The interconnect layer 47 is flat and may be bent more than once.

Figure 10A:
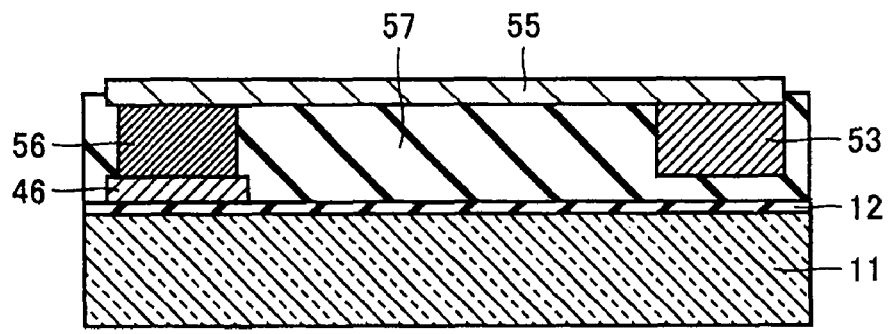
FIG. 10A is a cross-sectional view taken along lines 10A-10A of FIG. 9.
Figure 10B:
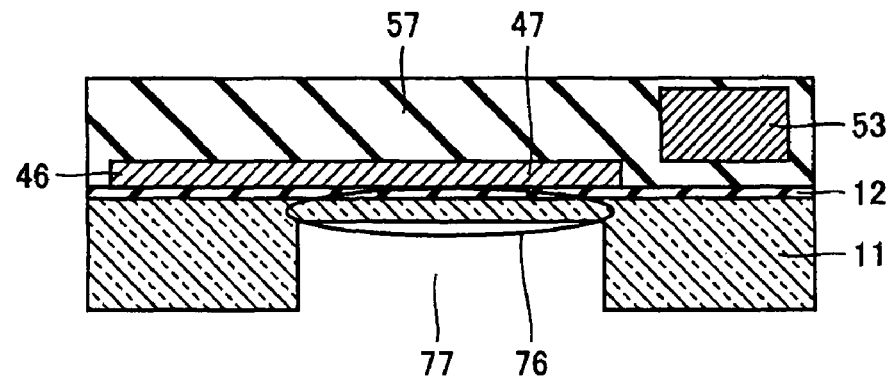
FIG. 10B is a cross-sectional view taken along lines 10B-10B of FIG. 9.
Figure 10C:
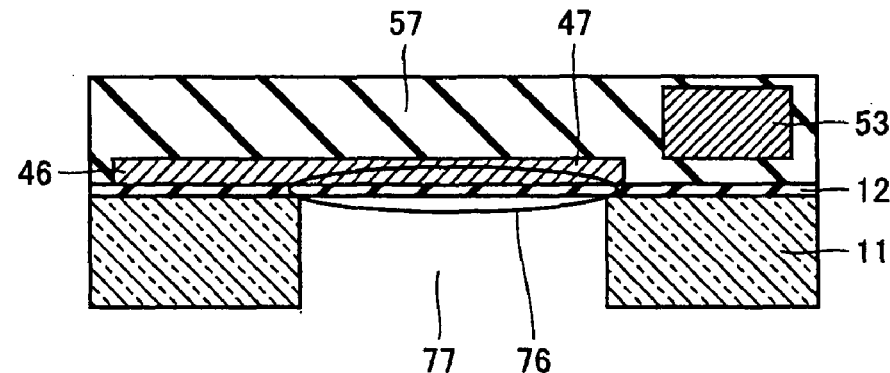
FIG. 10C is a cross-sectional view of another example, taken along lines 10B-10B of FIG. 9.
Figure 10D:
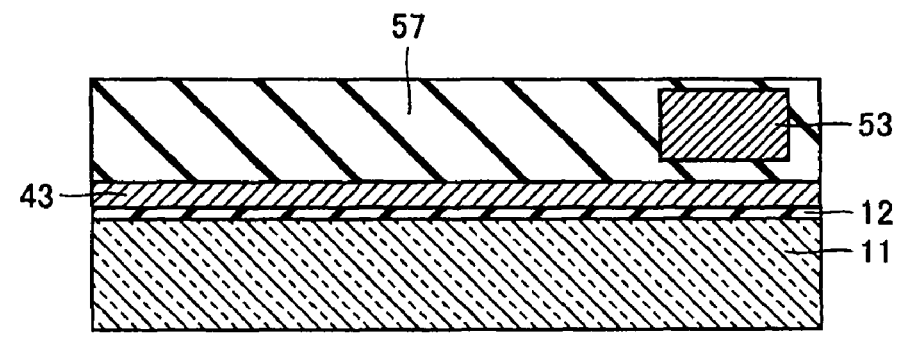
FIG. 10D is a cross-sectional view taken along lines 10D-10D of FIG. 9.

The substrate 11 is etched away to have a space 77 but partially remains as shown in FIG. 10B. A membrane 76, which is made up with the remaining part of the substrate 11 and the insulating film 12, is formed on the top of the space 77. The substrate 11 does not need to be partially left because the membrane 76 can be made from the insulating film 12 alone as shown in FIG. 10C.

In order to bring the wiring layers 43 and 53 in a connected state in the initial state the interconnect layer 47 is formed on the membrane 76. When mechanical pressure is applied to the interconnect layer 47 through the membrane 76 by a pin, for example, the interconnect layer 47 can be readily cut. To cut readily, the interconnect layer 47 is formed to be narrower than the wiring layers 45, 46, 55, or otherwise made of a thin metallic material. Other switches 72 to 74 are also configured in the same manner as the switch 71.

In this embodiment, the switches 71 to 74 are all in the connected state when the switch array 70 is fabricated, but cutting the interconnect layer 47 can bring a switch corresponding to the cut interconnect layer 47 into a disconnected state. Since the connection of the switches is made by connecting the wiring layer 43 or 44 for input and the wiring layer 53 or 54 for output through the interconnect layer 47 by way of the wiring layers 45, 46, 55, the switches have almost no on-resistance, and therefore a large current flow does not cause voltage drop at the switches 71 to 74.

In the above description, a pin was used to cut the interconnect layer 47. In yet another embodiment, an interconnect layer 47 having a high resistance component is prepared. The high resistance component can be obtained by making the layer thinner and/or narrower than the other wiring layers 43, 45, 46, 55, 53. Such an interconnect layer 47 can be fused by feeding a large current flow through the interconnect layer 47 with an application of a voltage between the input pad 41 and output pad 51. In this example, there in no special need to provide the membrane 76 because the large current flow readily cuts the interconnect layer 47.

FIG. 11 illustrates a modification of the switch included in the switch array shown in FIG. 9. A switch 71a included in a switch array 70a shown in FIG. 11 is an excerpt of the corresponding parts from the switch 71 shown in FIG. 9, and comprises a membrane 80 with an opening formed around the outer edge thereof to facilitate breaking the membrane, instead of the membrane 76. This opening, which plays a role of a cutoff line, facilitates cutting the interconnect layer 47 when pressure is applied to the membrane 80 by a pin or the like.

Figure 12:
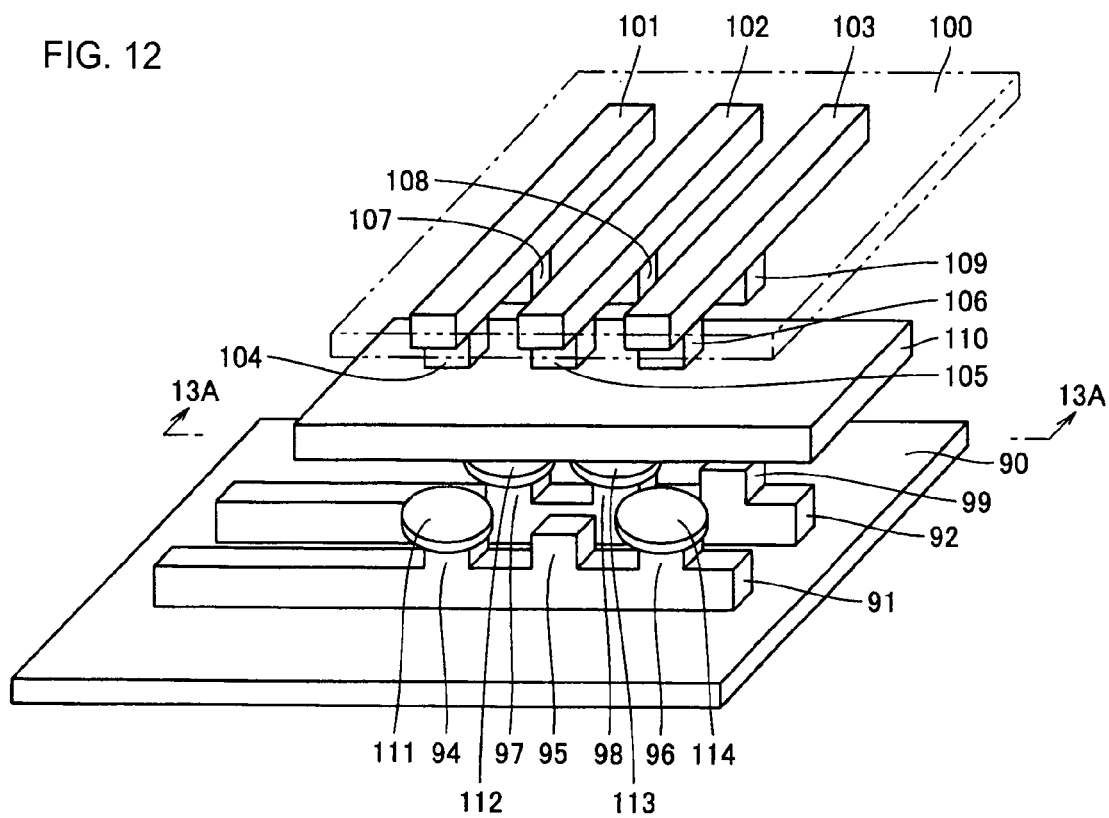
FIG. 12 is a perspective view illustrating a switch array according to yet another embodiment of the present invention.
Figure 13A:
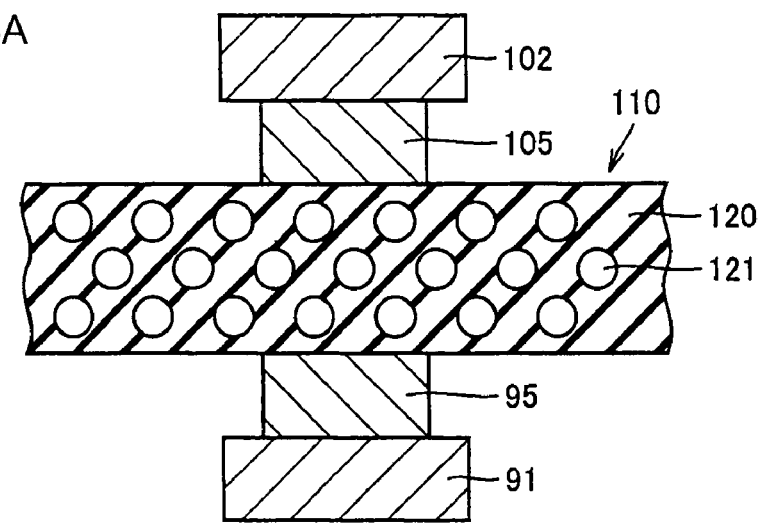
FIG. 13A is a cross-sectional view of wiring layers, electrode pads and an anisotropic conductive sheet, taken along lines 13A-13A of FIG. 12.
Figure 13B:
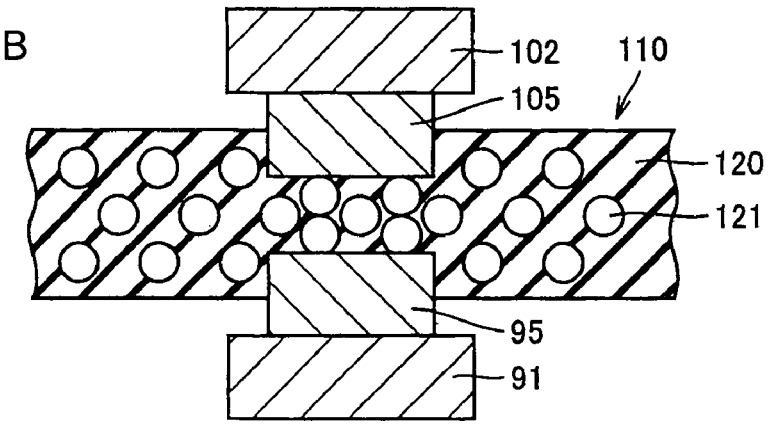
FIG. 13B is a cross-sectional view of the wiring layers, electrode pads and anisotropic conductive sheet, taken along lines 13A-13A of FIG. 12, the electrode pad being pressed.
Figure 13C:
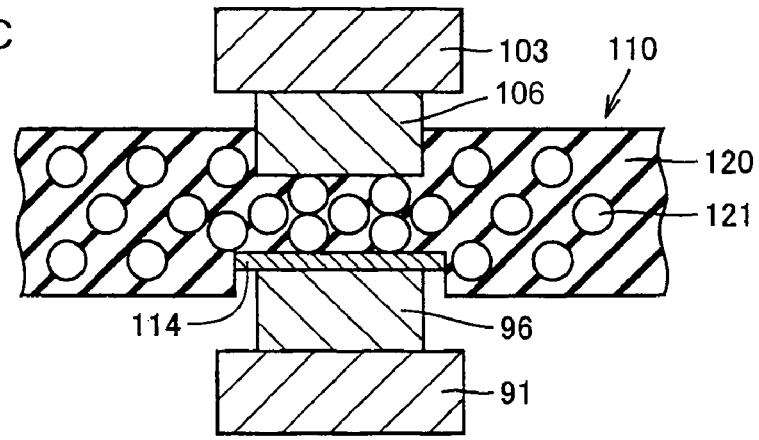
FIG. 13C is a cross-sectional view of the wiring layers, electrode pads and anisotropic conductive sheet, the electrode pad being pressed, and the pad being insulated from the conducting particles by an insulator.

FIG. 12 is a perspective view illustrating a switch array according to yet another embodiment of the present invention. FIGS. 13A to 13C are cross-sectional views of upper and lower wiring layers, electrode pads and an anisotropic conductive sheet, taken along lines 13A-13A of FIG. 12.

Lower wiring layers 91, 92 functioning as a plurality of first wiring layers are provided on a lower substrate 90 shown in FIG. 12, while upper wiring layers 101 to 103 functioning as a plurality of second wiring layers are provided on the underside of the upper substrate 100 so as to three-dimensionally cross the lower wiring layers 91, 92. The lower wiring layers 91, 92 have pads 94 to 99 formed thereon, while the upper wiring layers 101 to 103 have pads 104 to 109 formed thereunder and opposed to the pads 94 to 99, respectively. These pads 94 to 99 and 104 to 109 are connection areas, or electrodes.

Either one group of the lower wiring layers 91, 92 and the upper wiring layers 101 to 103 herein are made from a pressure-deformable member, however they do not necessarily require being made from the deformable member. An alternative example may include that previously interposing an insulator between pads that are not intended to conduct and displacing the upper substrate 100 and lower substrate 90 by pressing the upper substrate 100 against the lower substrate 90 (or squeezing both substrates together), thereby obtaining a desired electrical connection. In order to maintain an electrical connected state, a mechanism is needed to maintain the displacement caused by squeezing the upper and lower substrates 90, 100 together. This mechanism can be realized with a package including spring structure, for example.

Arranged between the lower wiring layers 91, 92 and the upper wiring layers 101 to 103 is an elastic anisotropic conductive sheet 110. The anisotropic conductive sheet 110 comprises an insulating sheet 120 having a predetermined thickness and conducting particles 121 mixed into the insulating sheet 120 as shown in FIGS. 13A to 13C. When the upper wiring layer 102 or lower wiring layer 91 is not under pressure, the insulating sheet 120 keeps an insulated state between the pad 105 and pad 95 as shown in FIG. 13A.

When the pad 105 of the upper wiring layer 102 is pressed from above, for example, the pad 105 presses the anisotropic conductive sheet 110 as shown in FIG. 13B and the conducting particles 121 in the anisotropic conductive sheet 110 make contact with each other, thereby electrically connecting the pad 105 and pad 95. The tops of the pads 94, 96, 97, 98 around the pad 95 on the lower wiring layers 91, 92 are covered with insulators 111 to 113 such as insulating paste.

When the pad 106 of the upper wiring layer 103 is pressed from above as shown in FIG. 13C, the anisotropic conductive sheet 110 pressed by the pad 106 causes the conducting particles 121 to make contact with each other, however because the pad 96 is covered with the insulator 114, the conducting particles 121 will not contact with the pad 96. Thus, the pad 106 is not electrically connected to the pad 96.

In the embodiment shown in FIG. 12, it is previously determined that pressing force applied to the pad 105 of the upper wiring layer 102 makes an electrical connection between the pad 105 and pad 95 through the anisotropic conductive sheet 110, and pressing force applied to the pad 109 of the upper wiring layer 103 makes an electrical connection between the pad 109 and pad 99 through the anisotropic conductive sheet 110. In the case where the pads 94, 96, 97, 98 on the lower wiring layers 91, 92 are required to electrically connect to the pads 104, 106, 107, 108 on the upper wiring layers 101 to 103, the insulators 111 to 113 may be removed on an as-needed basis.

Because the anisotropic conductive sheet 110 has elasticity as discussed above, when the anisotropic conductive sheet 110 in the state of FIG. 13B is released from pressure for example, the anisotropic conductive sheet 110 is returned to the state of FIG. 13A. However, provision of a connection-maintaining member can maintain the connected state shown in FIG. 13B. Examples of the connection-maintaining member include the use of the thermoplastic sheet shown in FIGS. 1A to 1C or the foam sheet described in FIGS. 3A and 3B for the upper substrate 100 or lower substrate 90.

Thus according to the embodiment, pressing the upper wiring layer 102 on the pad 105 can make an electrical contact with the desired pad 95 thorough the anisotropic conductive sheet 110, for example, thereby enabling a large current flow, reducing the on-resistance and negating the need for a driving current while maintaining the connected state.

Figure 14:
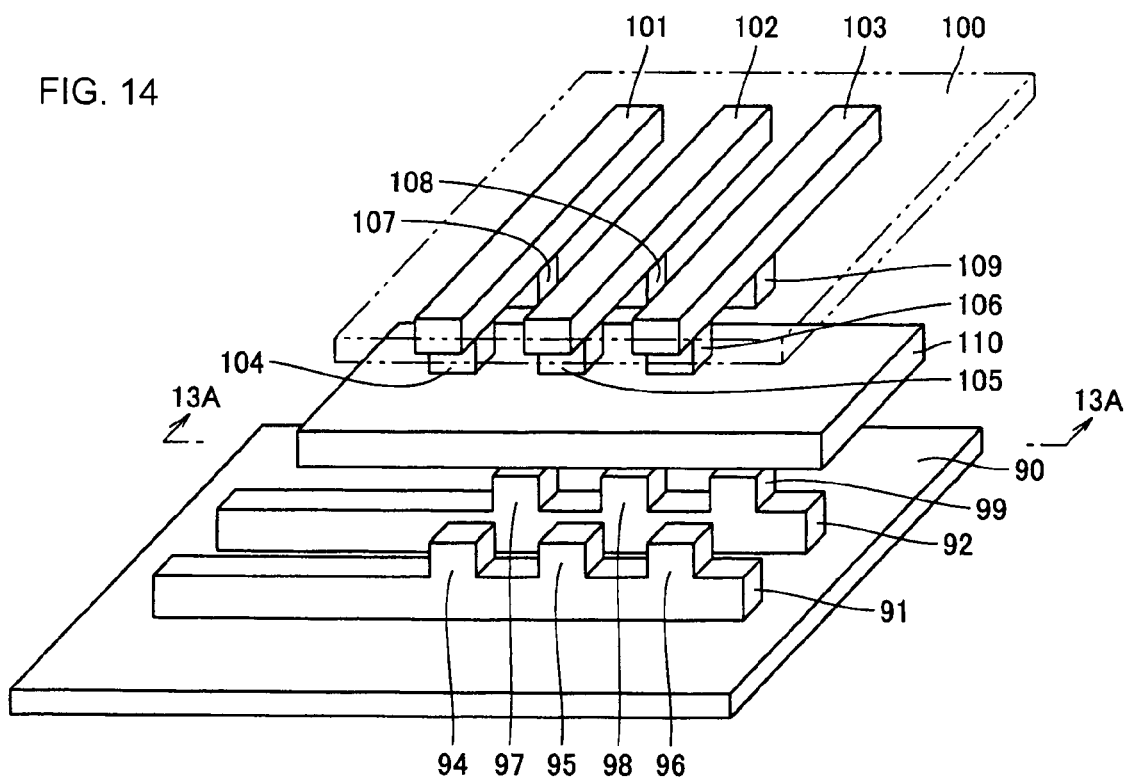
FIG. 14 illustrates a modification of the embodiment shown in FIG. 12.

FIG. 14 illustrates a modification of the embodiment shown in FIG. 12. In the embodiment shown in FIG. 12, the insulators 111, 114, 112, 113 cover the tops of the pads 94, 96, 97, 98, respectively, except for the pad 95 that is electrically connected to the pad 105 through the anisotropic conductive sheet 110 when the upper wiring layer 102 on the pad 105 is pressed from above. On the contrary, no insulator covers the pads 94, 96, 97, 98 in the embodiment shown in FIG. 14.

In this embodiment, for example, only the pad 105 is electrically connected to the pad 95 through the anisotropic conductive sheet 110 by pressing the upper wiring layer 102 on the pad 105 from the above with the use of the pin 20 shown in FIG. 1B to partially displace the upper wiring layer 102. Because only a part of the upper wiring layer 102, positioned on the pad 105, is displaced, the pads 104, 106, 107, 108, 109 around the pad 105 are not displaced, and therefore these pads 104, 106, 107, 108, 109 never electrically connect to the pads 94, 96, 97, 98, 99, respectively.

Figure 15:
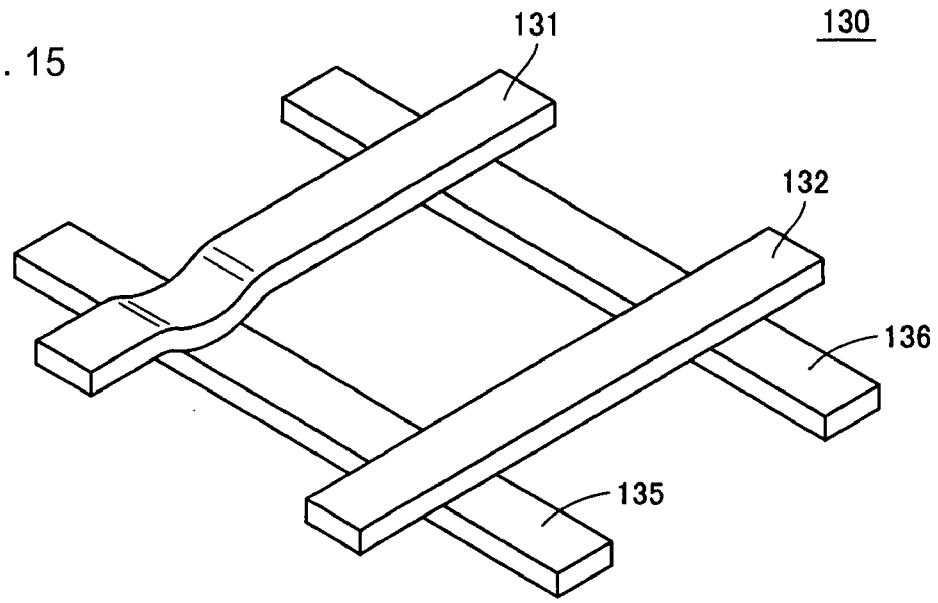
FIG. 15 is a perspective view illustrating a switch array according to yet another embodiment of the invention.

FIG. 15 is a perspective view illustrating a switch array in yet another embodiment of the present invention. A switch array 130 shown in FIG. 15 comprises upper wiring layers 131, 132 functioning as displaceable first wiring layers and lower wiring layers 135, 136 functioning as second and third wiring layers. The upper wiring layers 131, 132 are arranged so as to be opposed to and three-dimensionally cross the lower wiring layers 135, 136 with a predetermined space therebetween. The upper wiring layers 131, 132 and the lower wiring layers 135, 136 are insulated at their respective crossing parts in the initial state. When a part, which crosses the lower wiring layer 135, of the upper wiring layer 131 is selectively pressed by the pin 20 shown in FIGS. 1A to 1C, for example, only the crossing part of the upper wiring layer 131 is displaced to contact with the lower wiring layer 135, thereby making an electrical connection.

In order to maintain the displacement of the upper wiring layer 131, the thermoplastic sheet shown in FIGS. 1A to 1C or the foam sheet shown in FIGS. 3A and 3B may be also arranged on the upper wiring layers 131, 132 as a connection-maintaining member in this embodiment. Alternatively, if the upper wiring layers 131, 132 are made of a material that is displaceable and can maintain the displacement, an electrical connection can be made by displacing any one of the crossing parts of the upper wiring layers 131, 132 without the connection-maintaining member.

Figure 16:
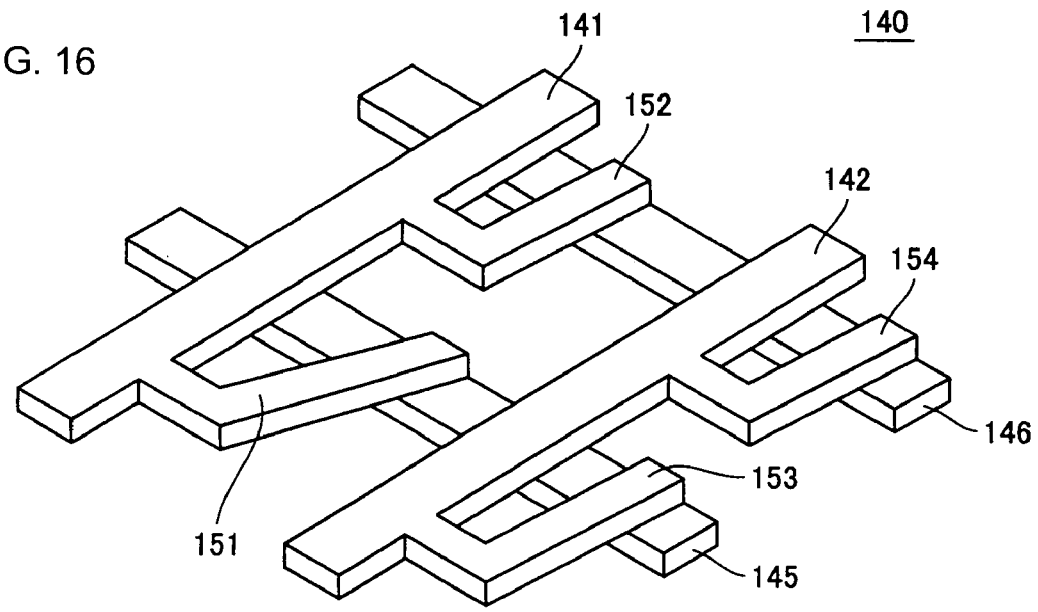
FIG. 16 is a perspective view illustrating a switch array according to yet another embodiment of the invention.

FIG. 16 is a perspective view illustrating a switch array according to yet another embodiment of the present invention. A switch array 140 of this embodiment comprises upper wiring layers 141, 142 and lower wiring layers 145, 146 three-dimensionally crossing the upper wiring layers 141, 142 with a predetermined space therebetween. The upper wiring layer 141 includes a first and second branch layers 151, 152 branched off therefrom and opposed to the lower wiring layers 145, 146, while the upper wiring layer 142 includes branch layers 153, 154 branched off therefrom and opposed to the lower wiring layers 145, 146. The branch layers 151 to 154 are made of a displaceable material.

In this embodiment, when an end of the branch layer 151 is displaced by a pin 20 shown in FIGS. 1A to 1C, for example, the end of the branch layer 151 contacts with the lower wiring layer 145 to make an electrical connection. In order to maintain the displacement of the branch layer 151, the thermoplastic sheet shown in FIGS. 1A to 1C or the foam sheet shown in FIGS. 3A and 3B may be also arranged as a connection-maintaining member on the upper wiring layers 141, 142 in this embodiment. Alternatively, if the branch layers 151 to 154 are made of a material that is displaceable and can maintain the displacement, there is no necessity to provide the connection-maintaining member.

The foregoing has described the embodiments of the present invention by referring to the drawings. However the invention should not be limited to the illustrated embodiments. It should be appreciated that various modifications and changes can be made to the illustrated embodiments within the scope of the appended claims and their equivalents.

INDUSTRIAL APPLICABILITY

The switch array according to the present invention can be utilized to pass and interrupt a large amount of current.

What is claimed is:

1. A switch array comprising:
a first wiring layer;
a second wiring layer three-dimensionally crossing said first wiring layer; and
a connecting structure disposed in a cross area of said first wiring layer and second wiring layer and for selectively connecting said first wiring layer and second wiring layer, wherein
said connecting structure comprises a deformable member having one end connected to said first wiring layer and the other end opposed to said second wiring layer with a space therebetween in an insulated state, said deformable member being deformed to electrically connect said other end thereof to said second wiring layer and maintaining the connection.

2. The switch array according to claim 1 comprising:
a first substrate; and
a second substrate disposed at a distance from said first substrate, wherein
said first substrate is provided with said first wiring layer and a through-hole formed near a position aligned with the other end of said deformable member,
said connecting structure includes a connection-maintaining member arranged so as to cover said through-hole,
said connection-maintaining member passes through said through-hole while changing its shape to press said deformable member.

3. The switch array according to claim 2, wherein said connection-maintaining member is deformed by application of heat to press said deformable member.

4. The switch array according to claim 2, wherein said connection-maintaining member has thermal deformation characteristics and shrinks and changes its shape by application of heat to press said deformable member.

5. The switch array according to claim 1, further comprising:
a connection maintaining member, said connection-maintaining member including an adhesive member for maintaining the connection between said deformed deformable member and said second wiring layer with an adhesive force.

6. The switch array according to claim 5, further comprising:
a first substrate; and
a second substrate disposed at a distance from said first substrate, the second substrate including a through-hole, wherein the adhesive member is provided at a position overlapping the through-hole in a plan view.

7. The switch array according to claim 6, wherein the adhesive member does not overlap the other end of the connecting structure in the plan view.

8. The switch array according to claim 6, wherein the adhesive member does not directly contact the other end of the connecting structure.

9. The switch array according to claim 5, wherein the adhesive member comprises an organic resin.

10. A switch array comprising:
a first wiring layer disposed on one surface of an insulating layer;
a second wiring layer disposed on the other surface of the insulating layer so as to three-dimensionally cross said first wiring layer in an insulated state; and
a through-hole formed in an area of the insulating layer where said first wiring layer three-dimensionally crosses said second wiring layer, said through-hole being filled with a conductive member, wherein
said conductive member filled in said through-hole electrically connects said first wiring layer and second wiring layer.

11. A switch array comprising:
a first wiring layer;
a second wiring layer three-dimensionally crossing said first wiring layer in a connected state; and
a connecting structure disposed in a three-dimensional cross area, said connecting structure being for selectively electrically connecting said first wiring layer and second wiring layer, wherein
said connecting structure includes an interconnect layer having one end connected to said first wiring layer and the other end connected to said second wiring layer, said interconnect layer breaking the connection between said first wiring layer and second wiring layer by being cut.

12. The switch array according to claim 11 further comprising a film extending over a space, wherein
said interconnect layer formed on said film is cut by application of mechanical pressure.

13. The switch array according to claim 11, wherein
said interconnect layer is a wiring layer having a high resistance component as compared with those of said first and second wiring layers, and is fused by feeding a large current between said first and second wiring layers.

14. A switch array comprising:
first wiring layers;
second wiring layers three-dimensionally crossing said first wiring layers; and
connecting structures disposed in respective cross areas between said first wiring layers and second wiring layers and for selectively connecting said first and second wiring layers, wherein
at least one group of either said first or second wiring layers is displaceable toward the other one of said first or second wiring layers and maintains its displacement,
said connecting structures include a conductive member arranged between said first and second wiring layers and producing conductivity at only a part thereof that is applied with pressure,
said connecting structures include connection areas opposed to both of said first and second wiring layers and electrically connecting said first and second wiring layers by displacing either first wiring layer or second wiring layer to apply a pressure to the conductive member.

15. The switch array according to claim 14, wherein
said connection areas are electrodes provided on said first and second wiring layers, and
said connection areas further include insulators provided on electrodes other than predetermined electrodes.

16. The switch array according to claim 14, wherein
said conductive member is made from an insulative elastic sheet containing conducting particles.

17. A switch array comprising:
first wiring layers;
second wiring layers three-dimensionally crossing said first wiring layers in an insulated state;
third wiring layers three-dimensionally crossing said first wiring layers in an insulated state; and
connecting structures disposed in respective cross areas between said first wiring layers and said second and third wiring layers and for selectively connecting said first wiring layers and said second or third wiring layers, wherein
said first wiring layers partially displace themselves at crossing parts thereof that three-dimensionally cross said second and third wiring layers, and maintain the displacement of the part, and a selectively displaced part realizes an electrical connection between said first wiring layers and second or third wiring layers.

18. The switch array according to claim 17, wherein
each of said first wiring layers includes a first branch layer and a second branch layer branched off therefrom and three-dimensionally crossing said second and third wiring layers,
said first branch layer and second branch layer are displaceable and maintain the displacement, and a displaced branch layer realizes an electrical connection at its crossing part with said second and third wiring layers.

* * * * *